United States Patent
Zhang et al.

(10) Patent No.: US 11,626,269 B2
(45) Date of Patent: *Apr. 11, 2023

(54) CHAMBER SEASONING TO IMPROVE ETCH UNIFORMITY BY REDUCING CHEMISTRY

(71) Applicants: Mattson Technology, Inc., Fremont, CA (US); Beijing E-Town Semiconductor Technology, Co., LTD, Beijing (CN)

(72) Inventors: Qi Zhang, San Jose, CA (US); Xinliang Lu, Fremont, CA (US); Hua Chung, Saratoga, CA (US)

(73) Assignees: BEIJING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/201,081

(22) Filed: Mar. 15, 2021

(65) Prior Publication Data

US 2021/0202214 A1    Jul. 1, 2021

Related U.S. Application Data

(63) Continuation of application No. 16/658,259, filed on Oct. 21, 2019, now Pat. No. 10,950,416.
(Continued)

(51) Int. Cl.
*H01J 37/32* (2006.01)
*H01L 21/67* (2006.01)
*H01L 21/311* (2006.01)

(52) U.S. Cl.
CPC .. *H01J 37/32495* (2013.01); *H01J 37/32467* (2013.01); *H01L 21/31116* (2013.01);
(Continued)

(58) Field of Classification Search
CPC ........... H01J 37/32495; H01J 37/32467; H01J 37/3211; H01J 37/32174;
(Continued)

(56) References Cited

U.S. PATENT DOCUMENTS 4,885,067 A    12/1989  Doty
5,275,798 A     1/1994  Aida
(Continued)

FOREIGN PATENT DOCUMENTS

CN    109904054 A    12/2017
CN    110246738 A     3/2018
(Continued)

OTHER PUBLICATIONS

Bao et al., "Mechanistic Study of Plasma Damage and CH4 Recovery of Low k Dielectric Surface," 2007 IEEE International Interconnect Technology Conference, Jun. 4-6, 2007, pp. 1-3.
(Continued)

*Primary Examiner* — Duy Vu N Deo
(74) *Attorney, Agent, or Firm* — Dority & Manning, P.A.

(57) ABSTRACT

Processes for surface treatment of a workpiece are provided. In one example implementation, a method can include conducting a pre-treatment process on a processing chamber to generate a hydrogen radical affecting layer on a surface of the processing chamber prior to performing a hydrogen radical based surface treatment process on a workpiece in the processing chamber. In this manner, a pretreatment process can be conducted to condition a processing chamber to increase uniformity of hydrogen radical exposure to a workpiece.

15 Claims, 10 Drawing Sheets

Related U.S. Application Data

(60) Provisional application No. 62/768,423, filed on Nov. 16, 2018.

(52) U.S. Cl.
CPC ..... *H01L 21/67069* (2013.01); *H01J 37/3211* (2013.01); *H01J 37/32174* (2013.01); *H01J 2237/3321* (2013.01); *H01J 2237/3341* (2013.01)

(58) Field of Classification Search
CPC ...... H01J 2237/3321; H01J 2237/3341; H01L 21/31116; H01L 21/67069
USPC ........ 438/700, 710, 712, 714, 722, 723, 750
See application file for complete search history.

(56) References Cited

U.S. PATENT DOCUMENTS

| | | |
|---|---|---|
| 5,811,022 A | 9/1998 | Savas et al. |
| 6,028,015 A | 2/2000 | Wang |
| 6,107,197 A | 8/2000 | Suzuki |
| 6,677,251 B1 | 1/2004 | Lu |
| 6,805,139 B1 | 10/2004 | Savas et al. |
| 6,808,647 B1 | 10/2004 | Xu et al. |
| 7,541,200 B1 | 6/2009 | Schravendijk et al. |
| 7,604,708 B2 | 10/2009 | Wood et al. |
| 7,807,579 B2 | 10/2010 | Yang |
| 7,901,743 B2 | 3/2011 | Lee et al. |
| 8,080,109 B2 * | 12/2011 | Okada ...................... B08B 5/00 134/1.1 |
| 8,821,987 B2 | 9/2014 | Shanker |
| 9,087,676 B2 | 7/2015 | Katsunuma et al. |
| 9,214,319 B2 | 12/2015 | Nagorny et al. |
| 9,397,196 B2 | 7/2016 | Sim et al. |
| 9,837,270 B1 | 12/2017 | Varadarajan |
| 10,269,574 B1 | 4/2019 | Yang et al. |
| 10,290,476 B2 | 5/2019 | Hirayama |
| 10,950,416 B2 * | 3/2021 | Zhang ............... H01L 21/31116 |
| 2002/0058397 A1 | 5/2002 | Smith et al. |
| 2003/0042465 A1 | 3/2003 | Ko |
| 2003/0134051 A1 | 7/2003 | Jung et al. |
| 2004/0154743 A1 | 8/2004 | Savas |
| 2006/0081273 A1 | 4/2006 | McDermott |
| 2006/0081558 A1 | 4/2006 | Collins et al. |
| 2007/0072422 A1 | 3/2007 | Yeh |
| 2007/0190266 A1 | 8/2007 | Fu |
| 2008/0261405 A1 | 10/2008 | Yang |
| 2008/0286982 A1 | 11/2008 | Li et al. |
| 2008/0293248 A1 | 11/2008 | Park et al. |
| 2009/0093129 A1 | 4/2009 | Park et al. |
| 2009/0274610 A1 | 11/2009 | Ghoanneviss et al. |
| 2010/0093187 A1 | 4/2010 | Lee et al. |
| 2011/0117751 A1 | 5/2011 | Sonthalia |
| 2012/0285481 A1 | 11/2012 | Lee et al. |
| 2013/0034968 A1 | 2/2013 | Zhang et al. |
| 2013/0263783 A1 | 10/2013 | Keto |
| 2014/0113532 A1 | 4/2014 | Smith |
| 2014/0261186 A1 | 9/2014 | Cho |
| 2015/0108493 A1 | 4/2015 | Kang |
| 2015/0126027 A1 | 5/2015 | Matsumoto |
| 2015/0239759 A1 | 8/2015 | Kang |
| 2015/0303065 A1 | 10/2015 | Buckalew |
| 2016/0020089 A1 | 1/2016 | Thadani |
| 2016/0079062 A1 | 3/2016 | Zheng |
| 2016/0260616 A1 | 9/2016 | Li et al. |
| 2016/0276134 A1 | 9/2016 | Collins |
| 2017/0207069 A1 * | 7/2017 | Bhatia ............... H01J 37/32862 |
| 2019/0378692 A1 * | 12/2019 | Zhang .................. H01J 37/321 |

FOREIGN PATENT DOCUMENTS

| | | |
|---|---|---|
| CN | 110473802 A | 4/2019 |
| KR | 10-0777043 | 11/2007 |
| WO | WO 2010-045153 | 4/2010 |
| WO | WO 2017/147365 | 8/2017 |

OTHER PUBLICATIONS

"HMDS," Retrieved from the internet May 17, 2018, https://www.microchemicals.com/products/adhesion_promotion/hmds.html—2 pages.

PCT International Search Report and Written Opinion for corresponding PCT Application No. PCT/US2019/057167, dated Feb. 17, 2020, 10 pages.

* cited by examiner

CHAMBER SEASONING TO IMPROVE ETCH UNIFORMITY BY REDUCING CHEMISTRY

PRIORITY CLAIM

The present application is a continuation of U.S. application Ser. No. 16/658,259 having a filing date of Oct. 21, 2019. Applicant claims priority to and the benefit of each of such application and incorporates such application herein by reference in its entirety.

PRIORITY CLAIM

The present application claims the benefit of priority of U.S. Provisional Application Ser. No. 62/768,423, titled "Chamber Seasoning to Improve Etch Uniformity by Reducing Chemistry," filed Nov. 16, 2019, which is incorporated herein by reference.

FIELD

The present disclosure relates generally to surface treatment of a workpiece using hydrogen radicals.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Plasma sources can be used to generate hydrogen radicals for exposure to a workpiece. The hydrogen radicals can be used for dry etch, dry strip, and/or surface treatment processes.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method can include conducting a pre-treatment process on a processing chamber to generate a hydrogen radical affecting layer on a surface of the processing chamber. The method can further include subsequent to performing the pre-treatment process, performing a hydrogen radical based surface treatment process on a workpiece in the processing chamber. The hydrogen radical based surface treatment process can expose the workpiece to a plurality of hydrogen radicals in the processing chamber.

Another example aspect of the present disclosure is directed to a method for processing a semiconductor workpiece. The method can include generating one or more species using a plasma induced in a first chamber. The method can include filtering the one or more species generated by the plasma to create the first mixture. The method can include injecting hydrogen gas into the first mixture post filtering to create a second mixture. The second mixture can include a plurality of hydrogen radicals. The method can include exposing the semiconductor workpiece to the second mixture in a second chamber. A surface of the second chamber can include a hydrogen radical affecting layer to reduce hydrogen radical recombination on the surface of the second chamber.

Other example aspects of the present disclosure are directed to systems, methods, and apparatus for seasoning a chamber for hydrogen radical treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
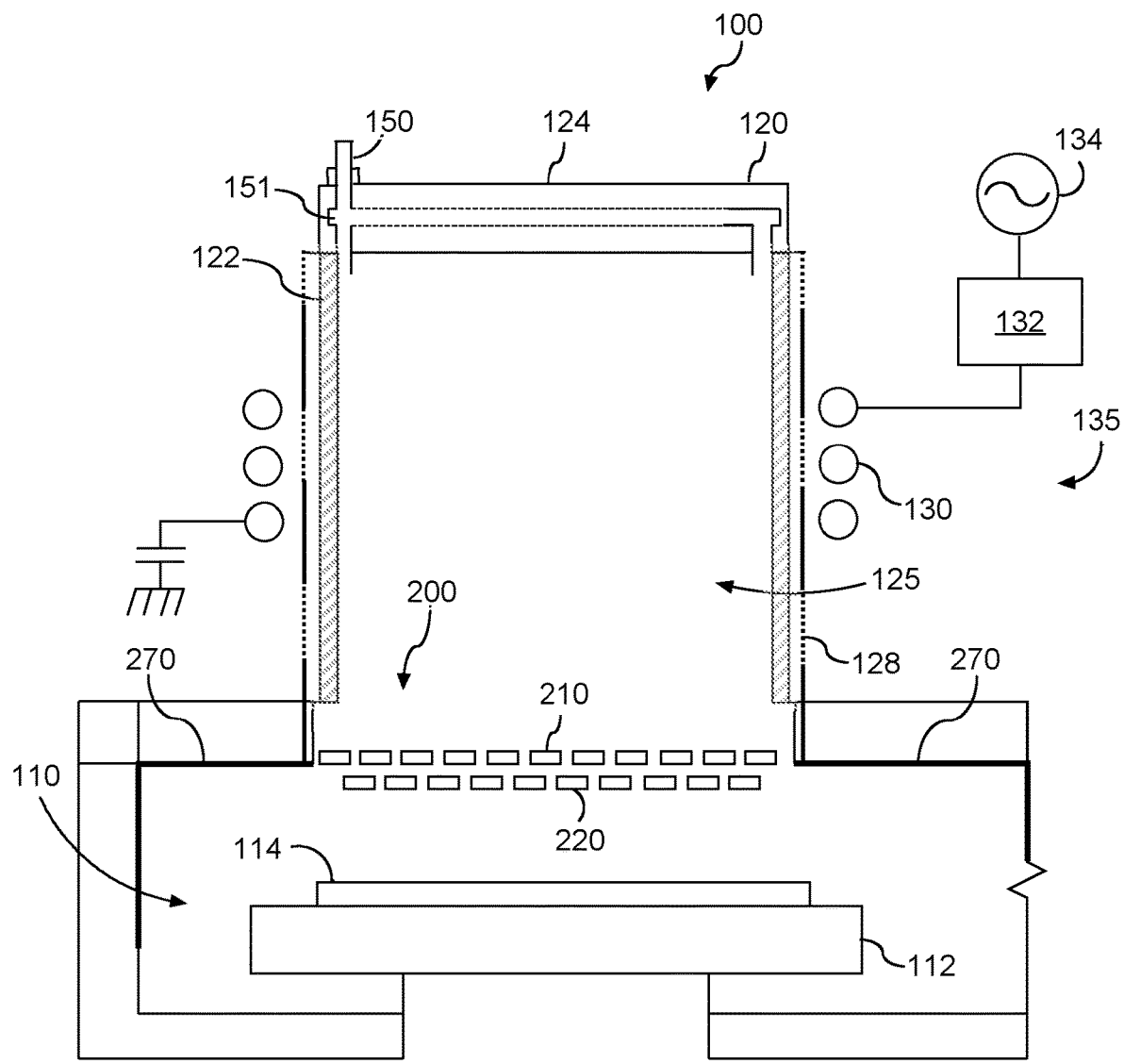
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for processing a workpiece using hydrogen radicals. More particularly, a pretreatment process can be conducted to condition a processing chamber to increase uniformity of hydrogen radical exposure to a workpiece.

Hydrogen radicals and other reducing chemical radicals have been widely used in semiconductor processing for instance, for surface treatment and silicon etching, silicon surface smoothing etc. However, hydrogen radicals can have a very short life time and can easily recombine on some surfaces (e.g., silicon and metals). In contrast, a recombination rate of the hydrogen radicals can be much slower on other surfaces, such as, silicon dioxide ($SiO_2$), aluminum oxide ($Al_2O_3$), etc. When processing a semiconductor workpiece inside a chamber, the hydrogen radicals can be very sensitive to the workpiece surroundings as well as path of the hydrogen radicals. This can make the hydrogen radical concentration reaching on the wafers non-uniform, thereby deteriorating process uniformity.

In some processes, hydrogen radicals can be generated by helium plasma with hydrogen ($H_2$) molecules in a gas phase. Reactive species generated can be applicable for surface treatment and materials removal. The removal on workpiece surface generally can suffer non-uniformity due to a loading effect: hydrogen radicals (and other reducing radicals) can be consumed somewhere inside a chamber. Example aspects of the present disclosure are directed to seasoning the chamber to make the hydrogen radicals consumed more uniformly. As such, hydrogen radical process uniformity on the workpiece can be improved.

Example aspects of the present disclosure are directed to conducting a pre-treatment process on a processing chamber to generate a hydrogen radical affecting layer on a surface of the processing chamber prior to performing a hydrogen radical based surface treatment process on a workpiece in the processing chamber. The pre-treatment process can generate a hydrogen radical affecting layer on a surface of the processing chamber, such as workpiece surroundings and/or one or more paths through which the hydrogen radical passes. After the pre-treatment process, the hydrogen radical based surface treatment process can then be implemented on a surface of the workpiece. In this manner, improved process uniformity can be obtained for semiconductor processing (e.g., surface treatment, etching, surface smoothing, etc.).

In some embodiments, the hydrogen radical affecting layer can be defined as a layer to reduce hydrogen radical recombination. The layer can absorb hydrogen radicals (also referred to as a hydrogen radical consuming layer) or can provide low hydrogen radical recombination (also referred to as a hydrogen radical non-consuming layer). For instance, the hydrogen consuming layer can be a silicon-containing layer generated by semiconductor byproduct material, or a layer generated by silane deposition. As another example, the hydrogen non-consuming layer can be a layer containing silicon dioxide ($SiO_2$) and/or aluminum oxide ($Al_2O_3$).

In some embodiments, the pre-treatment process can conduct a plasma etch process on the workpiece in the processing chamber for a process period to deposit semiconductor byproduct material on the surface of the processing chamber to generate at least a portion of the hydrogen radical affecting layer. For instance, the plasma etch process can run for extended time (e.g., in a range of about 30 seconds to 5 minutes) to have a semiconductor byproduct coating deposited on workpiece surroundings (e.g., a chamber wall, a separation grid, pedestal, etc.).

In some embodiments, the coating can form a hydrogen radical consuming layer to make the workpiece surroundings similar to materials being treated or etched. In this way, density of the hydrogen radicals can be more uniform at various positions on workpiece. As such, process uniformity of a hydrogen radical based surface treatment process on workpiece can be improved.

In some embodiments, the coating can oxidize (e.g., after exposure to oxygen) to form the hydrogen radical non-consuming layer. The hydrogen radical non-consuming layer can reduce the absorption of hydrogen radicals on the workpiece surroundings. As such, process uniformity of a hydrogen radical based surface treatment process on workpiece can be improved if the workpiece originally suffers from insufficient hydrogen radicals at workpiece edges.

In some embodiments, the pre-treatment process can expose the processing chamber to a silicon containing gas (e.g., silane ($SiH_4$) disilane ($Si_2H_6$) or trisilane ($Si_3H_8$)). For instance, the silicon containing gas can be injected into the processing chamber to generate at least a portion of the hydrogen radical consuming layer on the surface of the processing chamber.

In some embodiments, the pre-treatment process can coat the surface of the processing chamber with the hydrogen radical non-consuming layer. For instance, the pre-treatment can coat the workpiece surroundings, the separation grid and the path with some materials that reduce recombination rate of the hydrogen radicals. Such hydrogen radical non-consuming layer can include silicon dioxide ($SiO_2$) and/or aluminum oxide ($Al_2O_3$).

In some embodiments, the hydrogen radicals can be generated in a plasma chamber that is separated from the processing chamber by a separation grid. The hydrogen radicals can be generated, for instance, by inducing a plasma in a process gas. The process gas, for instance, can be a mixture including hydrogen ($H_2$) and a carrier gas, such as a mixture including $H_2$ and nitrogen ($N_2$), or can be a mixture including $H_2$ and helium (He), or can be a mixture including $H_2$ and Ar, or can be a mixture including $H_2$ and argon (Ar) and another inert gas (e.g., xenon (Xe)). In some other embodiments, the hydrogen radicals can be generated, for instance, using a heated filament, such as a heated tungsten filament.

In some other embodiments, the hydrogen radicals can be generated using post plasma gas injection. For instance, one or more excited inert gas molecules (e.g., excited He molecules) can be generated in a plasma chamber that is separated from a processing chamber by a separation grid. The excited inert gas molecules can be generated, for instance, by inducing a plasma in a process gas using a plasma source (e.g., inductive plasma source, capacitive plasma source, etc.). The process gas can be an inert gas. For instance, the process gas can be helium, argon, xenon, neon, or other inert gas. In some embodiments, the process gas can consist of an inert gas. A separation grid can be used to filter ions generated in the plasma chamber and allow passage of neutral species through holes in the separation grid to the processing chamber for exposure to the workpiece.

In some embodiments, the hydrogen radicals can be generated by mixing hydrogen gas ($H_2$) with the excited species at or below (e.g., downstream) of the separation grid. For instance, in some embodiments, the separation grid can have a plurality of grid plates. The hydrogen gas can be injected into species passing through the separation grid at a location below or downstream of one of the grid plates. In some embodiments, the hydrogen gas can be injected into species passing through the separation grid at a location between two grid plates. In some embodiments, the hydrogen gas can be injected into the species at a location beneath all of the grid plates (e.g., in the processing chamber).

Mixing the hydrogen gas with the excited species from the inert gas can result in the generation of a plurality of hydrogen radicals, such as neutral hydrogen radicals. The hydrogen radicals can be exposed to a workpiece in the processing chamber to implement surface treatment processes according to example embodiments of the present disclosure.

Example aspects of the present disclosure provide a number of technical effects and benefits. For instance, a pre-treatment on the processing chamber prior to conducting a hydrogen radical based surface treatment process can reduce hydrogen radical recombination on the surface of the processing chamber to improve process uniformity.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

FIG. 1 depicts an example plasma processing apparatus 100 according to example embodiments of the present disclosure. As illustrated, the plasma processing apparatus 100 includes a processing chamber 110 and a plasma chamber 120 that is separated from the processing chamber 110. The processing chamber 110 includes a workpiece support or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., a hydrogen gas and a carrier gas) can be provided to the chamber interior from a gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

Hydrogen radical affecting layers 270 can absorb hydrogen radicals (e.g., hydrogen radical consuming layers) and/or provide low hydrogen radical combination (e.g., hydrogen radical non-consuming layers) on the workpiece surroundings (e.g., a chamber wall, the separation grid, pedestal, etc.). As shown in FIG. 1, the processing chamber 110 can be pre-treated such that hydrogen radical affecting layers 270 are disposed on interior surface of the processing chamber 110. In some embodiments (not shown in FIG. 1), the hydrogen radical affecting layers 270 can be disposed on the separation grid 200, the pedestal 112, or other areas surrounding the workpiece 114. In this manner, improved process uniformity on workpiece can be obtained for hydrogen radical based processes.

In some embodiments, the hydrogen radical affecting layers 270 can be generated by conducting a plasma etch process on the workpiece 114 in the processing chamber 110 for a process period to deposit semiconductor by-product material on the surface of the processing chamber 110. For instance, the plasma etch process can run for extended time (e.g., in a range of about 30 seconds to 5 minutes) to have a semiconductor byproduct coating deposited on a workpiece 114 surroundings (e.g., interior wall of the processing chamber 110, the separation grid 200, the pedestal 112, etc.). The by-product material can be oxidized, for instance, to become $SiO_2$. The coating can absorb hydrogen radicals and/or reduce hydrogen recombination on the workpiece surroundings. As such, process uniformity of a hydrogen radical based surface treatment process on workpiece can be improved.

In some embodiments, the hydrogen radical affecting layers 270 (e.g., hydrogen radical consuming layers) can be generated by exposing the processing chamber 110 to a silicon containing gas (e.g., silane ($SiH_4$) disilane ($Si_2H_6$) or trisilane ($Si_3H_8$)). As one example, the silicon containing gas can be injected into the processing chamber 110 by a gas injection at or below the separation grid 200. As another example, the silicon containing gas can be injected into the processing chamber 110 by a gas inlet (not shown in FIG. 1) of the processing chamber 110. As another example, the silicon containing gas can be provided to the processing chamber 110 from the plasma chamber with the separation grid 200 acting as a showerhead for the silicon containing gas.

In some embodiments, the hydrogen radical affecting layers 270 (e.g., hydrogen radical non-consuming layers) can be coated on the interior surface (e.g., as part of the manufacturing process and/or other pre-treatment process) of the processing chamber 110 or other workpiece surroundings to reduce recombination rate of the hydrogen radicals. Such hydrogen radical affecting layer 270 can include silicon dioxide ($SiO_2$) and/or aluminum oxide ($Al_2O_3$).

Figure 2:
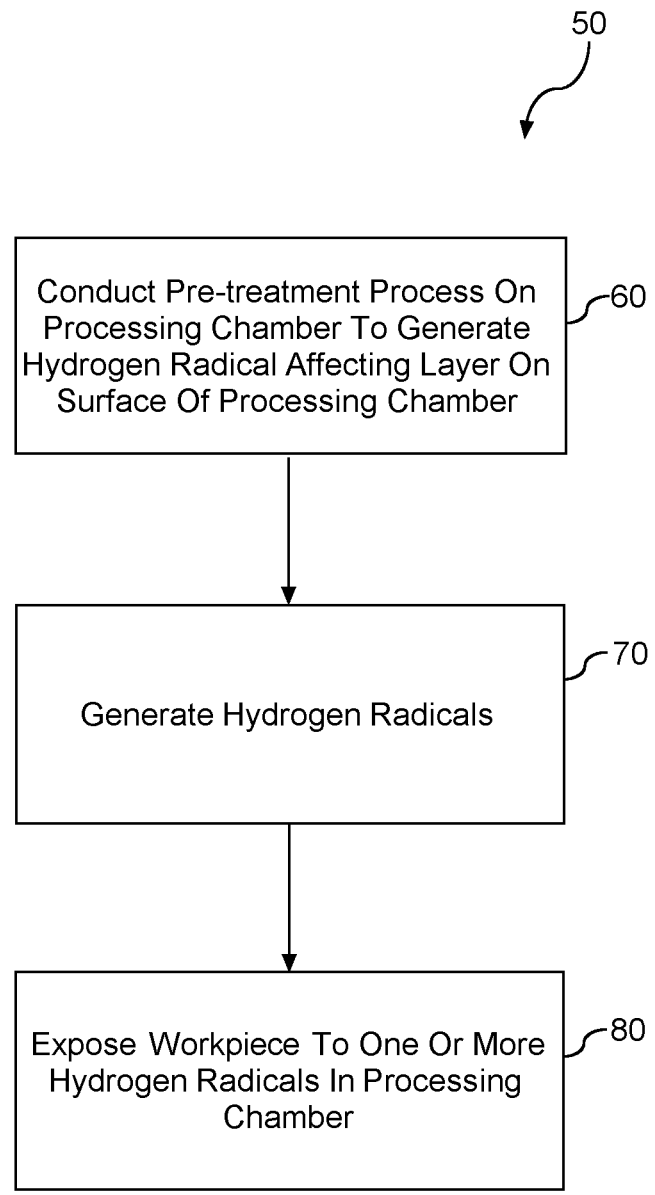
FIG. 2 depicts a flow diagram of an example method according to example embodiments of the present disclosure.

FIG. 2 depicts a flow diagram of an example method (50) according to example embodiments of the present disclosure. The method (50) can be implemented, for instance, using the plasma processing apparatus 100 in FIG. 1 or other suitable processing apparatus (e.g., see FIGS. 9 and 10). FIG. 1 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (60), the method can include conducting a pre-treatment process on a processing chamber to generate a hydrogen radical affecting layer on a surface of the processing chamber. For instance, a pre-treatment process can be conducted on the processing chamber 110 to generate the hydrogen radical affecting layer 270 on an interior surface of the processing chamber 110. In some embodiments, the pre-treatment process can include conducting a plasma etch process on the workpiece 114 in the processing chamber 110 for a process period to deposit semiconductor by-product material on the surface of the processing chamber 110 to generate the hydrogen radical affecting layer 270. In some embodiments, the pre-treatment process can expose the processing chamber 110 to a silicon containing gas (e.g., silane ($SiH_4$) disilane ($Si_2H_6$) or trisilane ($Si_3H_8$)). In some embodiments, the pre-treatment process can coat the surface of the processing chamber 110 with the hydrogen radical affecting layer 270 (e.g., hydrogen radical non-consuming layers).

At (70), the method can include generating a plurality of hydrogen radicals. Example methods for generating a plurality of hydrogen radicals are discussed below.

For example, the hydrogen radicals can be generated in the plasma chamber 120 that is separated from the processing chamber 110 by the separation grid 200. The hydrogen radicals can be generated, for instance, by inducing a plasma in a process gas. The process gas, for instance, can be a mixture including hydrogen ($H_2$) and a carrier gas, such as a mixture including $H_2$ and nitrogen ($N_2$), or can be a mixture including $H_2$ and helium (He), or can be a mixture including $H_2$ and Ar, or can be a mixture including $H_2$ and argon (Ar) and another inert gas (e.g., xenon (Xe)). In some other embodiments, the hydrogen radicals can be generated, for instance, using a heated filament, such as a heated tungsten filament.

In some embodiments, the hydrogen radicals can be generated using post plasma gas injection. For instance, one or more excited inert gas molecules (e.g., excited He molecules) can be generated in the plasma chamber 120 that is separated from the processing chamber 110 by the separation grid 200. The excited inert gas molecules can be generated, for instance, by inducing a plasma in a process gas using a plasma source (e.g., inductive plasma source, capacitive plasma source, etc.). The process gas can be an inert gas. For instance, the process gas can be helium, argon, xenon, neon, or other inert gas. In some embodiments, the process gas can consist of an inert gas. The separation grid 200 can be used to filter ions generated in the plasma chamber 120 and allow passage of neutral species through holes in the separation grid 200 to the processing chamber 110 for exposure to the workpiece 114.

In some embodiments, the hydrogen radicals can be generated by mixing hydrogen gas ($H_2$) with the excited species at or below (e.g., downstream) of the separation grid 200. For instance, in some embodiments, the separation grid 200 can have a plurality of grid plates. The hydrogen gas can be injected into species passing through the separation grid 200 at a location below or downstream of one of the grid plates. In some embodiments, the hydrogen gas can be injected into species passing through the separation grid 200 at a location between two grid plates. In some embodiments, the hydrogen gas can be injected into the species at a location beneath all of the grid plates (e.g., in the processing chamber 110).

At (80) of FIG. 2, the method can include exposing the workpiece to a plurality of hydrogen radicals in the processing chamber. As one example, the workpiece 114 can be exposed to hydrogen radicals generated in the plasma and passing through the separation grid assembly 200. As another example, the workpiece 114 can be exposed to hydrogen radicals generated using post plasma gas injection and/or a heated filament.

Figure 3:
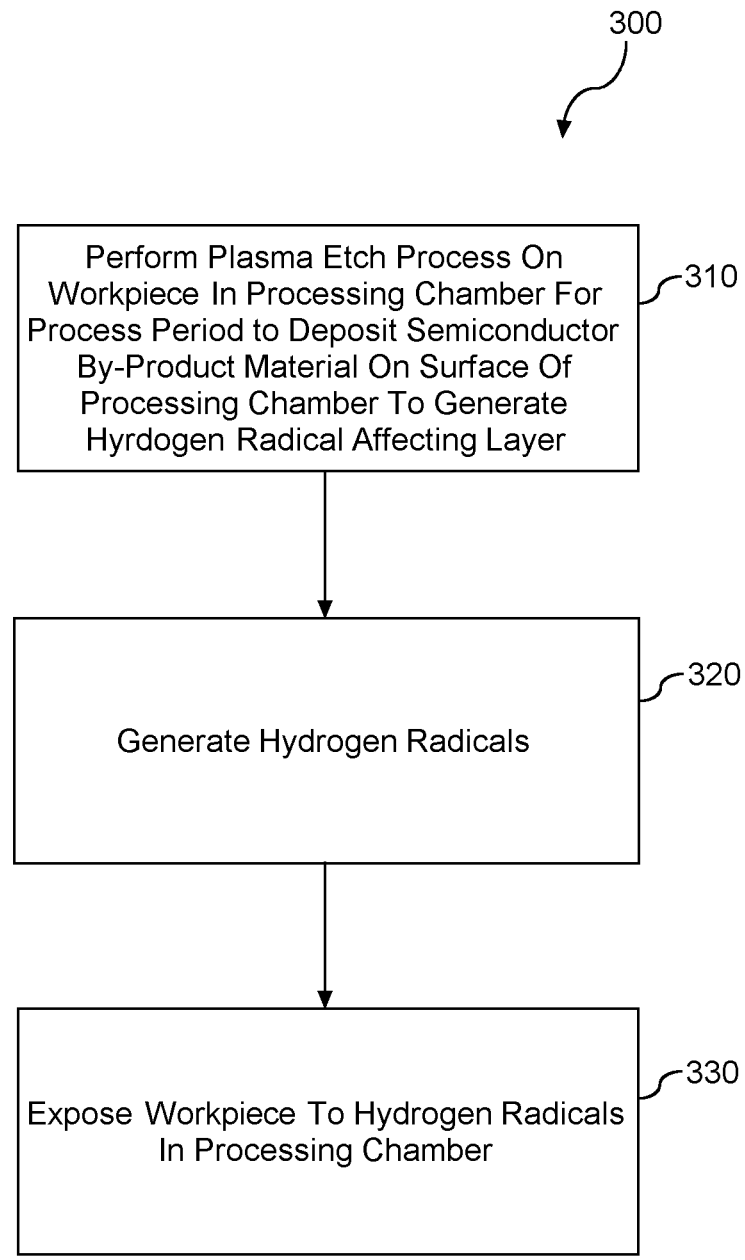
FIG. 3 depicts a flow diagram of an example method according to example embodiments of the present disclosure.

FIG. 3 depicts a flow diagram of an example method (300) according to example embodiments of the present disclosure. The method (300) can be implemented using the plasma processing apparatus 100 in FIG. 1 or other suitable processing apparatus (e.g., see FIGS. 9 and 10). FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (310), the method can include perform a plasma etch process on a workpiece in a processing chamber for a process period to deposit semiconductor byproduct material on a surface of the processing chamber to generate a hydrogen radical affecting layer. For instance, a plasma etch process (e.g., silicon etching process) can be implemented using the plasma processing apparatus 100. The plasma etch process can induce a plasma in a process gas to generate one or more species (e.g., ions and/or radicals). The species can be exposed to a workpiece to etch material (e.g., silicon) from the workpiece.

According to example aspects of the present disclosure, the plasma etch process can run for extended process period (e.g., in a range of about 30 seconds to 5 minutes) to have a semiconductor byproduct coating deposited on a workpiece surroundings (e.g., interior wall of the processing chamber 110, the separation grid 200, the pedestal 112, etc.). The coating can reduce the absorption of hydrogen radicals on the workpiece surroundings. In this way, the hydrogen radicals can be consumed more uniformly. As such, process uniformity of a hydrogen radical based surface treatment process on workpiece can be improved.

At (320), the method can include generating a plurality of hydrogen radicals. For instance, hydrogen radicals can be generated in a plasma chamber from a process gas and provided through a separation grid for exposure to a workpiece. In some embodiments, the hydrogen radicals can be generated using post-plasma gas injection and/or a heated filament.

At (330), the method can include exposing the workpiece to the plurality of hydrogen radicals in the processing chamber. As one example, the workpiece 114 can be exposed to hydrogen radicals generated in the plasma and passing through the separation grid assembly 200. As another example, the workpiece 114 can be exposed to hydrogen radicals generated using post plasma gas injection and/or a heated filament.

Figure 4:
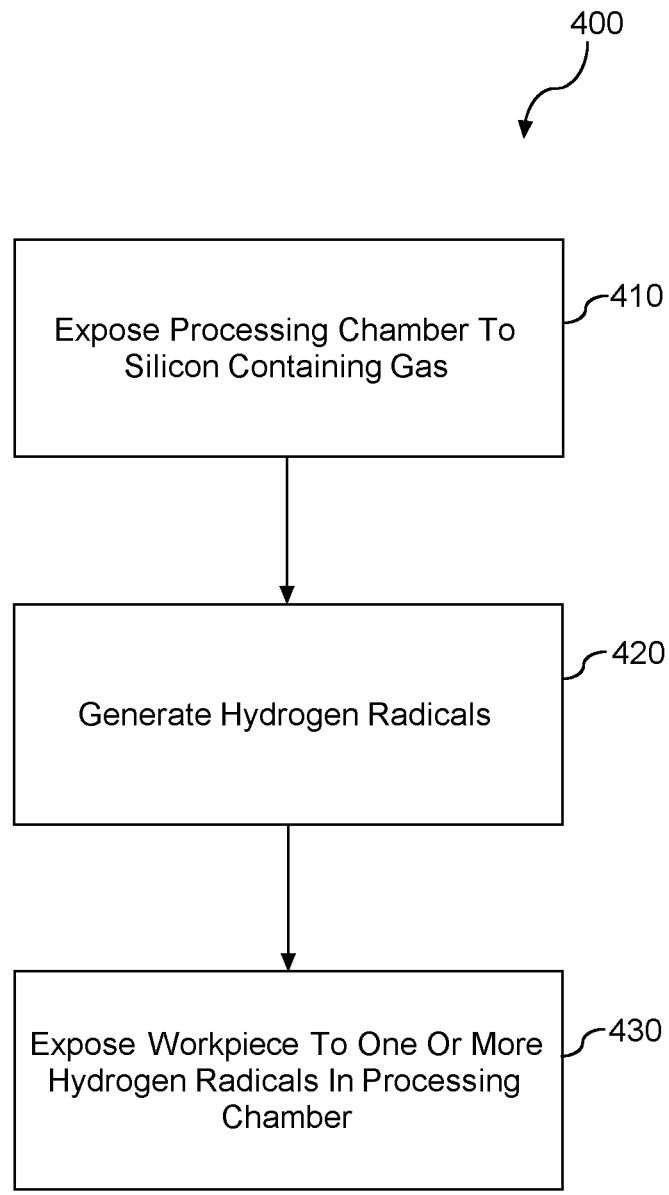
FIG. 4 depicts a flow diagram of an example method according to example embodiments of the present disclosure.

FIG. 4 depicts a flow diagram of an example method (400) according to example embodiments of the present disclosure. The method (400) can be implemented using the plasma processing apparatus 100 in FIG. 1 or other suitable processing apparatus (e.g., see FIGS. 9 and 10). FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (410), the method can include expose a processing chamber to a silicon containing gas. For instance, a silicon containing gas (e.g., silane ($SiH_4$) disilane ($Si_2H_6$) or trisilane ($Si_3H_8$)) can be injected into the processing chamber 110 to generate the hydrogen radical affecting layers 270 (e.g., hydrogen radical consuming layers). As one example, the silicon containing gas can be injected into the processing chamber 110 by a gas injection source located between the first grid plate 210 and the second grid plate 220. As another example, the silicon containing gas can be injected into the processing chamber 110 by a gas inlet (not shown in FIG. 1) of the processing chamber 110. As another example, the silicon containing gas can be emitted from the plasma chamber (without activation of the plasma source) through the separation grid 200 such that the separation grid 200 acts as a showerhead.

At (420), the method can include generating a plurality of hydrogen radicals. For instance, hydrogen radicals can be generated in a plasma chamber from a process gas and provided through a separation grid for exposure to a workpiece. In some embodiments, the hydrogen radicals can be generated using post-plasma gas injection and/or a heated filament.

At (430), the method can include expose the workpiece to a plurality of hydrogen radicals in the processing chamber. As one example, the workpiece 114 can be exposed to hydrogen radicals generated in the plasma and passing through the separation grid assembly 200. As another example, the workpiece 114 can be exposed to hydrogen radicals generated post plasma gas injection and/or a heated filament.

Figure 5:
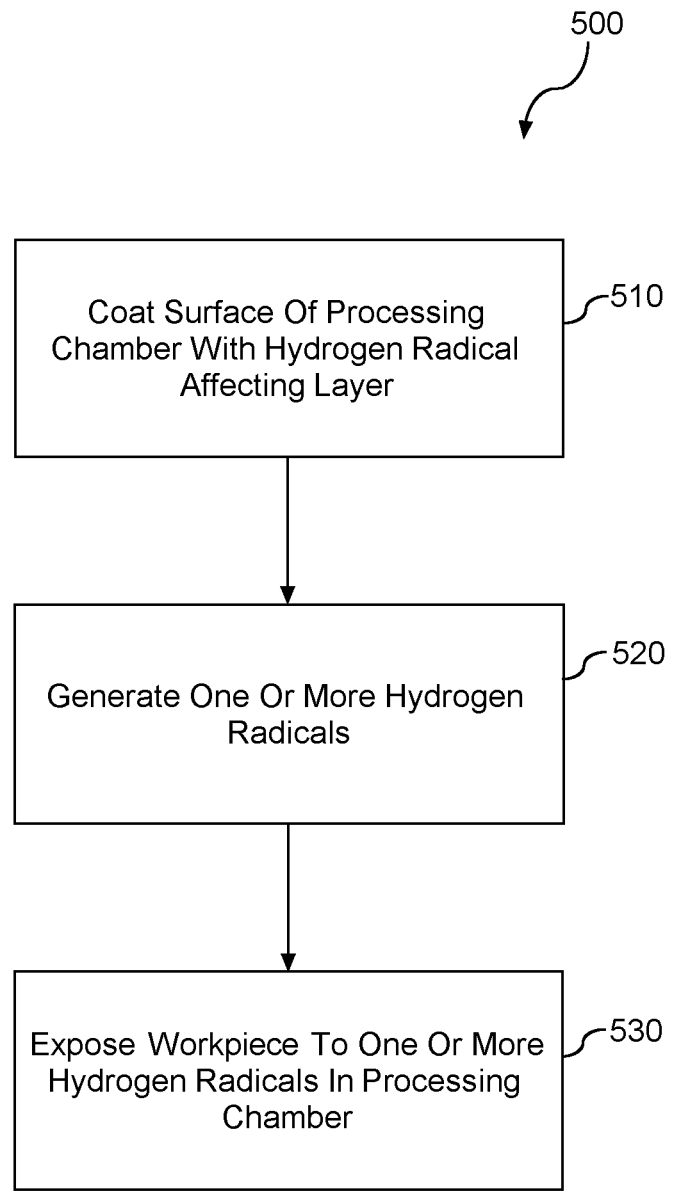
FIG. 5 depicts a flow diagram of an example method according to example embodiments of the present disclosure.

FIG. 5 depicts a flow diagram of an example method (500) according to example embodiments of the present disclosure. The method (500) can be implemented using the plasma processing apparatus 100 in FIG. 1 or other suitable processing apparatus (e.g., FIG. 9 or FIG. 10). FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (510), the method can include coat a surface of a processing chamber with a hydrogen radical affecting layer. For instance, the hydrogen radical affecting layers 270 (e.g., hydrogen radical non-consuming layers) can be coated on the interior surface of the processing chamber 110 or other workpiece surroundings to reduce recombination rate of the hydrogen radicals. Such hydrogen radical affecting layer 270 can include silicon dioxide ($SiO_2$) and/or aluminum oxide ($Al_2O_3$).

At (520), the method can include generating a plurality of hydrogen radicals. For instance, hydrogen radicals can be generated in a plasma chamber from a process gas and provided through a separation grid for exposure to a workpiece. In some embodiments, the hydrogen radicals can be generated using post-plasma gas injection and/or a heated filament.

At (530), the method can include expose the workpiece to a plurality of hydrogen radicals in the processing chamber. As one example, the workpiece 114 can be exposed to hydrogen radicals generated in the plasma and passing through the separation grid assembly 200. As another example, the workpiece 114 can be exposed to hydrogen radicals generated post plasma gas injection and/or a heated filament.

Figure 6:
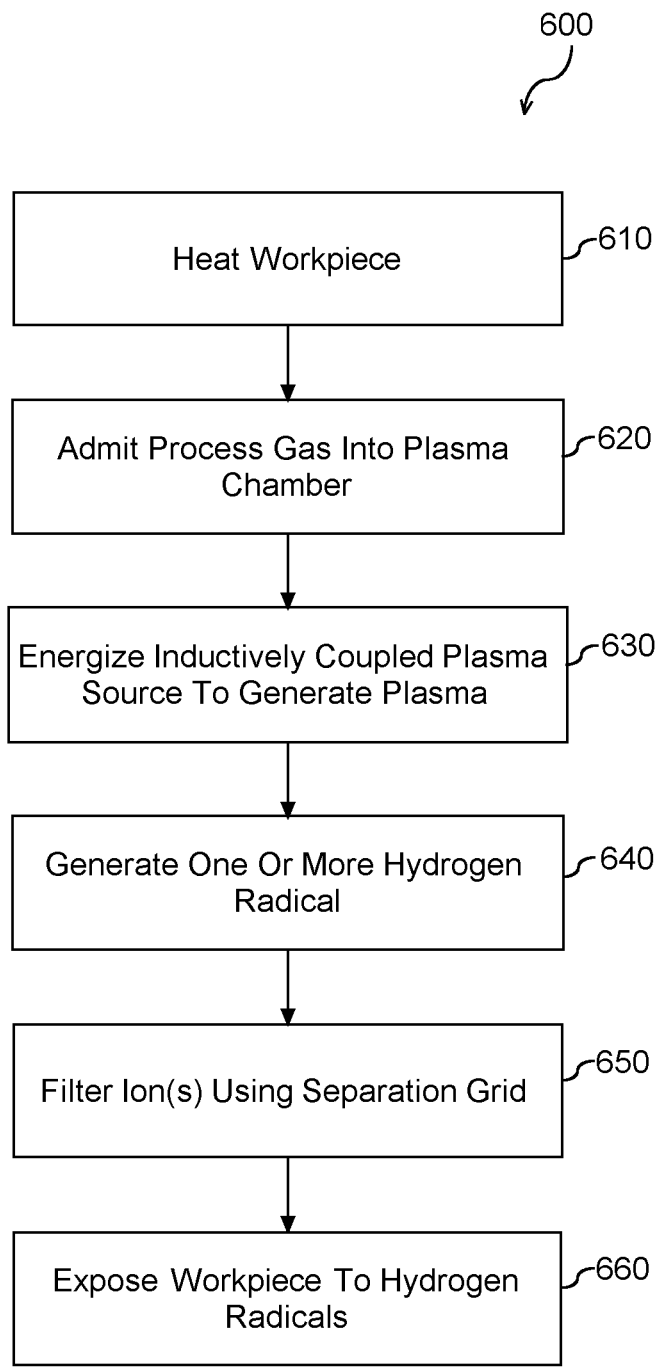
FIG. 6 depicts a flow diagram of an example method according to example embodiments of the present disclosure.

FIG. 6 depicts a flow diagram of an example method (600) for generating hydrogen radicals according to example embodiments of the present disclosure. The method (600) can be implemented using the plasma processing apparatus 100 in FIG. 1 or other suitable processing apparatus. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (610), the method can include heating the workpiece. For instance, the workpiece 114 can be heated in the processing chamber 110 to a process temperature. The workpiece 114 can be heated, for instance, using one or more heating systems associated with the pedestal 112. In some embodiments, the workpiece can be heated to a process temperature in the range of about 90° C. to about 400° C.

At (620), the method can include admitting a process gas into the plasma chamber. For instance, a process gas can be admitted into the plasma chamber interior 125 from a gas source 150 via annular gas distribution channel 151 or other suitable gas introduction mechanism. In some embodiments, the process gas can include a hydrogen gas. For instance, the process gas can include $H_2$ and carrier gas (e.g., $N_2$ or Ar or He or other inert gas or combination). A ratio of $H_2$ to carrier gas can be about 2 to about 100.

At (630), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. In some embodiments, the inductively coupled plasma source can be operated with a power in the range of about 660 W to about 5000 W. The plasma can be used to generate a plurality of hydrogen radicals from the hydrogen gas at (640).

At (650), the method can include filtering one or more ions generated by the plasma to create a filtered mixture. The filtered mixture can include neutral hydrogen radicals. In some embodiments, the one or more ions can be filtered using a separation grid assembly separating the plasma chamber from a processing chamber where the workpiece is located. For instance, the separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (660), the method can include exposing the workpiece to the hydrogen radicals. More particularly, the workpiece can be exposed to hydrogen radicals generated in the plasma and passing through the separation grid assembly. As one example, the workpiece 114 can be exposed to hydrogen radicals generated in the plasma and passing through the separation grid assembly 200. As another example, the workpiece 114 can be exposed to hydrogen radicals generated post plasma gas injection and/or a heated filament.

Figure 7:
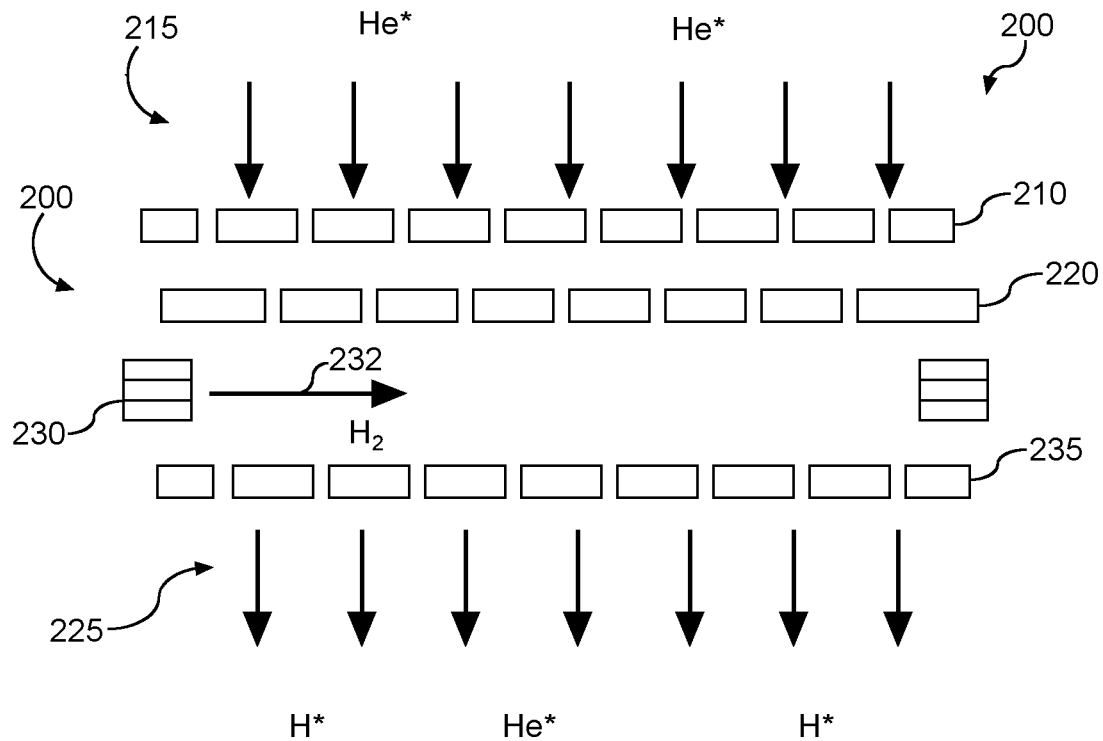
FIG. 7 depicts example generation of hydrogen radicals using post-plasma gas injection according to example embodiments of the present disclosure.

FIG. 7 depicts example generation of hydrogen radicals using post-plasma gas injection according to example embodiments of the present disclosure. More particularly, FIG. 7 depicts an example separation grid 200 for injection of hydrogen post-plasma according to example embodiments of the present disclosure. More particularly, the separation grid 200 includes a first grid plate 210 and a second grid plate 220 disposed in parallel relationship. The first grid plate 210 and the second grid plate 220 can provide for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Species (e.g., excited inert gas molecules) 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source 230 can be configured to mix hydrogen 232 into the species passing through the separation grid 200. A mixture 225 including hydrogen radicals resulting from the injection of hydrogen gas can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the hydrogen can be mixed with the species at any point in the separation grid and/or after the separation grid in the processing chamber. For instance, the gas injection source 230 can be located between first grid plate 210 and second grid plate 220.

Figure 8:
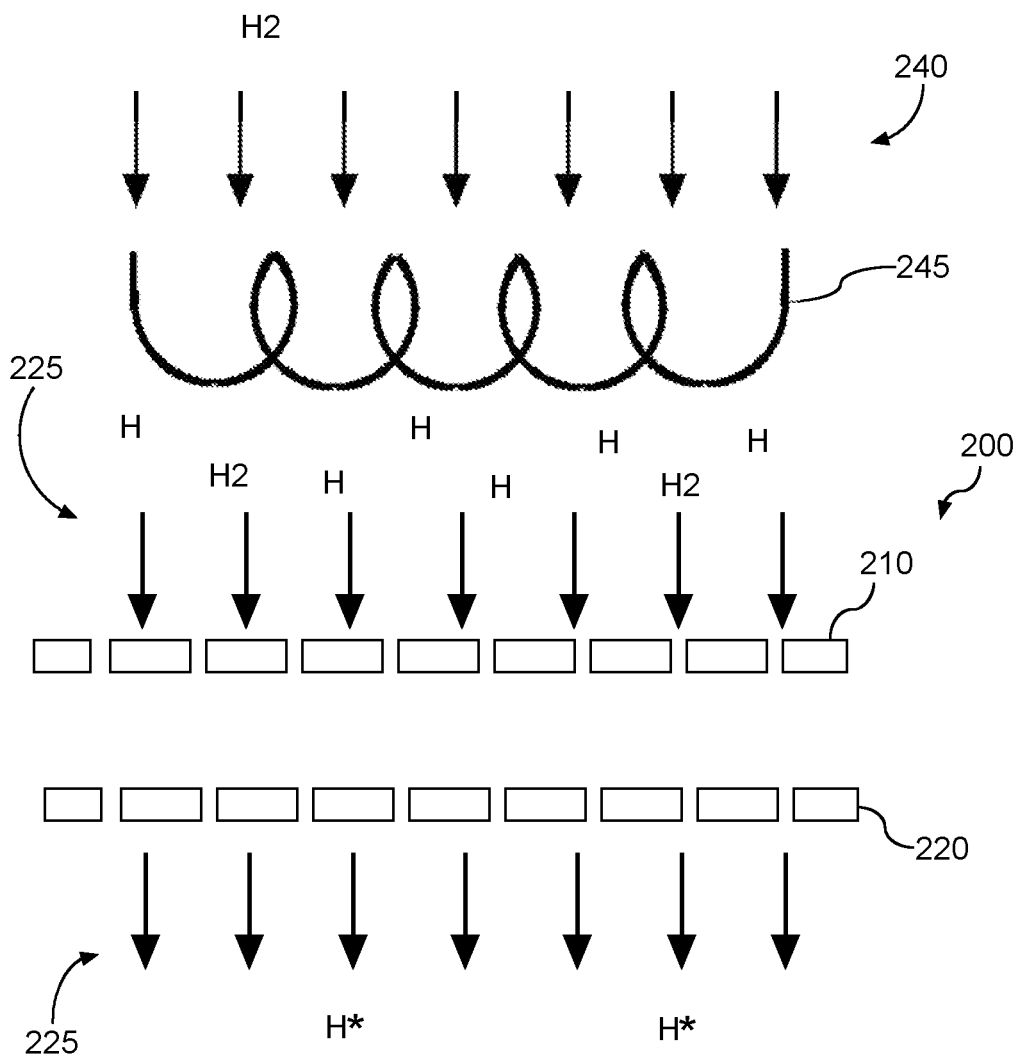
FIG. 8 depicts example generation of hydrogen radicals using a filament according to example embodiments of the present disclosure.

FIG. 8 depicts example generation of hydrogen radicals using a filament according to example embodiments of the present disclosure. As shown in FIG. 8, a hydrogen gas $H_2$ 240 can be passed over a heated filament 245 (e.g., a tungsten filament) to generate hydrogen radicals 225 in a first chamber. The hydrogen radicals 225 can be passed through a separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

The surface treatment and/or plasma etch process can be implemented using other plasma processing apparatus without deviating from the scope of the present disclosure.

Figure 9:
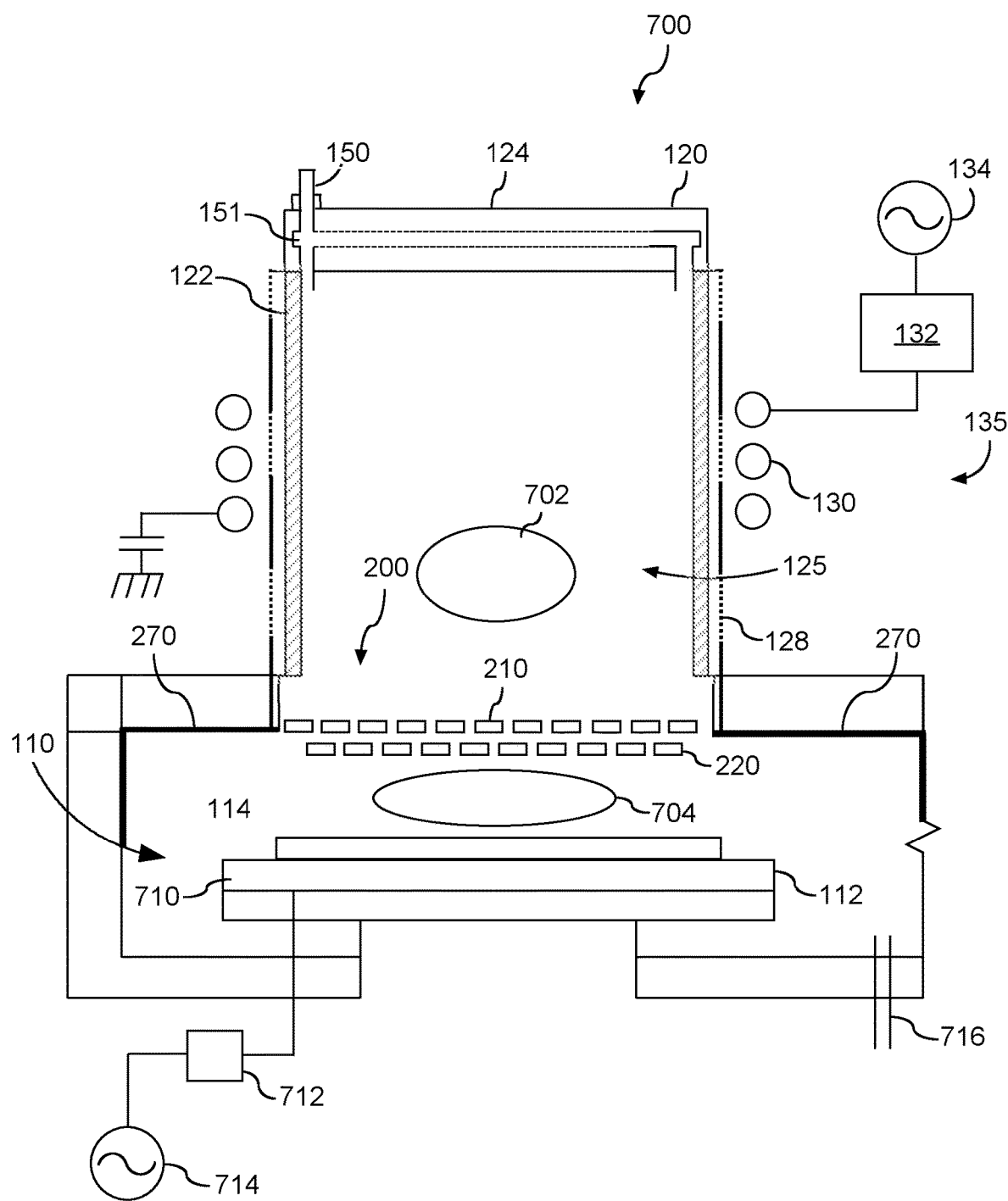
FIG. 9 depicts an example plasma processing apparatus according to example embodiments of the present disclosure.

FIG. 9 depicts an example plasma processing apparatus 700 that can be used to implement processes according to example embodiments of the present disclosure. The plasma processing apparatus 700 is similar to the plasma processing apparatus 100 of FIG. 1.

More particularly, the plasma processing apparatus 700 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 9, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

As discussed above, a hydrogen gas can be injected into species passing through the separation grid 200 to generate a plurality of hydrogen radicals for exposure to the workpiece 114. The hydrogen radicals can be used to implement a variety of semiconductor fabrication processes.

The example plasma processing apparatus 700 of FIG. 9 is operable to generate a first plasma 702 (e.g., a remote plasma) in the plasma chamber 120 and a second plasma 704 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 700 of FIG. 9 includes a bias source having bias electrode 710 in the pedestal 112. The bias electrode 710 can be coupled to an RF power generator 714 via a suitable matching network 712. When the bias electrode 710 is energized with RF energy, a second plasma 704 can be generated from a mixture in the processing chamber 110 for direct exposure to the workpiece 114. The processing chamber 110 can include a gas exhaust port 716 for evacuating a gas from the processing chamber 110. The hydrogen radicals can be generated using the first plasma 702 and/or the second plasma 704.

Hydrogen radical affecting layers 270 can absorb hydrogen radicals and/or provide low hydrogen recombination on the workpiece surroundings (e.g., a chamber wall, the separation grid, pedestal, etc.). As shown in FIG. 9, the processing chamber 110 can be pre-treated such that the hydrogen radical affecting layers 270 are deposited on interior surface of the processing chamber 110. In some embodiments (not shown in FIG. 9), the hydrogen radical affecting layers 270 can be disposed on the separation grid 200, the pedestal 112, or other areas surrounding the workpiece 114. In this manner, improved process uniformity on workpiece can be obtained for semiconductor processing (e.g., surface treatment, etching, surface smoothing, etc.).

Figure 10:
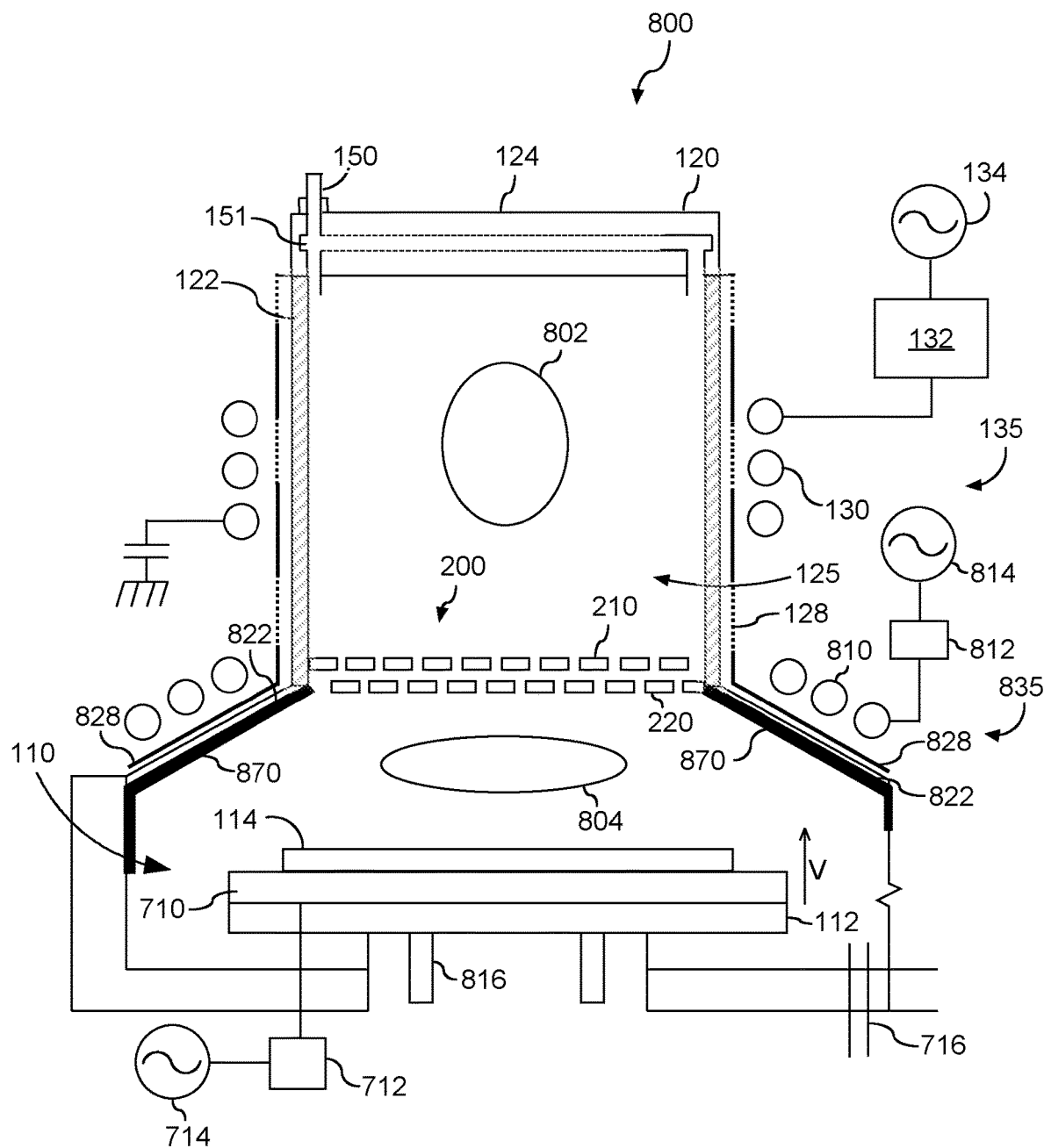
FIG. 10 depicts an example plasma processing apparatus according to example embodiments of the present disclosure.

FIG. 10 depicts a processing chamber 800 similar to that of FIG. 1 and FIG. 9. More particularly, plasma processing apparatus 800 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 10, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 800 of FIG. 10 is operable to generate a first plasma 802 (e.g., a remote plasma) in the plasma chamber 120 and a second plasma 804 (e.g., a direct plasma) in the processing chamber 110. As shown, the plasma processing apparatus 800 can include an angled dielectric sidewall 822 that extends from the vertical sidewall 122 associated with the remote plasma chamber 120. The angled dielectric sidewall 822 can form a part of the processing chamber 110.

A second inductive plasma source 835 can be located proximate the dielectric sidewall 822. The second inductive plasma source 835 can include an induction coil 810 coupled to an RF generator 814 via a suitable matching network 812. The induction coil 810, when energized with RF energy, can induce a direct plasma 804 from a mixture in the processing chamber 110. A Faraday shield 828 can be disposed between the induction coil 810 and the sidewall 822. In some embodiments, the Faraday shield 828 can be grounded.

The pedestal 112 can be movable in a vertical direction V. For instance, the pedestal 112 can include a vertical lift 816 that can be configured to adjust a distance between the pedestal 112 and the separation grid assembly 200. As one example, the pedestal 112 can be located in a first vertical position for processing using the remote plasma 802. The pedestal 112 can be in a second vertical position for processing using the direct plasma 804. The first vertical position can be closer to the separation grid assembly 200 relative to the second vertical position.

The plasma processing apparatus 800 of FIG. 10 includes a bias source having bias electrode 710 in the pedestal 112. The bias electrode 710 can be coupled to an RF power generator 714 via a suitable matching network 712. The processing chamber 110 can include a gas exhaust port 716 for evacuating a gas from the processing chamber 110. The hydrogen radicals can be generated using the first plasma 802 and/or the second plasma 804.

Hydrogen radical affecting layers 870 can absorb hydrogen radicals and/or provide low hydrogen radical recombination on the workpiece surroundings (e.g., a chamber wall, the separation grid, pedestal, etc.). As shown in FIG. 10, the processing chamber 110 can be pre-treated such that the hydrogen radical affecting layers 870 are deposited on interior surface of the processing chamber 110. In some embodiments (not shown in FIG. 10), the hydrogen radical affecting layers 870 can be disposed on the separation grid 200, the pedestal 112, or other areas surrounding the workpiece 114. In this manner, improved process uniformity on workpiece can be obtained for semiconductor processing (e.g., surface treatment, etching, surface smoothing, etc.). In some embodiments, the hydrogen radical affecting layers 870 can be one embodiment of the hydrogen radical affecting layers 270. In some embodiments, the hydrogen radical affecting layers 870 can be generated by conducting a plasma etch process on the workpiece 114 in the processing chamber 110 for a process period to deposit semiconductor by-product material on the surface of the processing chamber 110. In some embodiments, the hydrogen radical affecting layers 870 (e.g., hydrogen radical consuming layers) can be generated by exposing the processing chamber 110 to a silicon containing gas (e.g., silane ($SiH_4$) disilane ($Si_2H_6$) or trisilane ($Si_3H_8$)). In some embodiments, the hydrogen radical affecting layers 870 (e.g., hydrogen radical non-consuming layers) can be coated on the interior surface of the processing chamber 110 or other workpiece surroundings to reduce recombination rate of the hydrogen radicals. Such hydrogen radical affecting layer 870 can include silicon dioxide ($SiO_2$) and/or aluminum oxide ($Al_2O_3$).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a semiconductor material, the method comprising:
    conducting a pre-treatment process on a processing chamber to generate a hydrogen radical affecting layer on a surface of the processing chamber, the processing chamber separated from a plasma chamber by a separation grid having a first grid plate and a second grid plate, the pre-treatment process comprising injecting a pre-treatment process gas into the processing chamber via a gas injection source disposed between the first grid plate and the second grid plate;
    subsequent to performing the pre-treatment process, performing a hydrogen radical based surface treatment process on the workpiece in the processing chamber,
    wherein the hydrogen radical based surface treatment process exposes the workpiece to a plurality of hydrogen radicals in the processing chamber.

2. The method of claim 1, wherein the pre-treatment process gas comprises a silicon containing gas.

3. The method of claim 2, wherein the silicon containing gas comprises silane ($SiH_4$) disilane ($Si_2H_6$) or trisilane ($Si_3H_8$).

4. The method of claim 1, wherein the pre-treatment process comprises coating the surface of the processing chamber with the hydrogen radical affecting layer.

5. The method of claim 1, wherein the hydrogen radical affecting layer comprises silicon dioxide ($SiO_2$).

6. The method of claim 1, wherein the hydrogen radical affecting layer comprises aluminum oxide ($Al_2O_3$).

7. The method of claim 1, wherein the plurality of hydrogen radicals are generated from a process gas using an inductively coupled plasma source.

8. The method of claim 1, wherein the plurality of hydrogen radicals are generated by mixing a hydrogen gas with one or more excited inert gas molecules downstream of the plasma chamber.

9. A method of processing a semiconductor workpiece, the method comprising:
- coating a processing chamber with a hydrogen radical affecting layer, the process chamber separated from a plasma chamber by a separation grid having a first grid plate and a second grid plate, wherein coating the processing chamber with a hydrogen radical affecting layer comprises injecting a pre-treatment process gas into the processing chamber via a gas injection source disposed between the first grid plate and the second grid plate;
- generating one or more species using a plasma induced in a plasma chamber;
- filtering the one or more species generated by the plasma to create a first mixture;
- injecting hydrogen gas into the first mixture post filtering to create a second mixture, the second mixture comprising a plurality of hydrogen radicals;
- exposing the semiconductor workpiece to the second mixture in the processing chamber.

10. The method of claim 9, wherein a surface of the processing chamber is coated with the hydrogen radical affecting layer by exposing the processing chamber to a silicon containing gas.

11. The method of claim 10, wherein the silicon containing gas comprises silane ($SiH_4$) disilane ($Si_2H_6$) or trisilane ($Si_3H_8$).

12. The method of claim 9, wherein the hydrogen radical affecting layer comprises silicon dioxide ($SiO_2$).

13. The method of claim 9, wherein the hydrogen radical affecting layer comprises aluminum oxide ($Al_2O_3$).

14. The method of claim 1, wherein the separation grid comprises a third grid plate, the third grid plate disposed between the first grid plate and the plasma chamber.

15. The method of claim 9, wherein the separation grid comprises a third grid plate, the third grid plate disposed between the first grid plate and the plasma chamber.

* * * * *